(12) United States Patent
Hsiung et al.

(10) Patent No.: US 7,740,329 B2
(45) Date of Patent: Jun. 22, 2010

(54) SERVER RACK ASSEMBLY

(75) Inventors: Hai-Hung Hsiung, Taipei-Hsien (TW); Zhao-Guo Wen, Shenzhen (CN); Jie Li, Shenzhen (CN); Li-Hui Gao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 246 days.

(21) Appl. No.: 11/842,171

(22) Filed: Aug. 21, 2007

(65) Prior Publication Data

US 2008/0303390 A1   Dec. 11, 2008

(30) Foreign Application Priority Data

Jun. 7, 2007   (CN)   ............ 2007 2 0200454 U (51) Int. Cl.
*H05K 7/18* (2006.01)

(52) U.S. Cl. ............... 312/334.4; 312/334.5; 312/223.1

(58) Field of Classification Search ............ 312/334.4, 312/334.5, 330.1, 223.1, 265.1–265.4, 319.1; 211/26; 361/725–727
See application file for complete search history.

(56) References Cited

U.S. PATENT DOCUMENTS

| | | | |
|---|---|---|---|
| 6,230,903 B1 * | 5/2001 | Abbott | ............... 211/26 |
| 6,523,918 B1 | 2/2003 | Baiza | |
| 6,891,727 B2 * | 5/2005 | Dittus et al. | ............... 361/724 |
| 6,935,521 B2 * | 8/2005 | Gundlach et al. | ............ 211/183 |
| 6,948,691 B2 * | 9/2005 | Brock et al. | ............ 248/222.13 |
| 6,974,037 B2 * | 12/2005 | Haney | ............... 211/26 |
| 7,192,103 B2 * | 3/2007 | Hamilton | ............... 312/334.5 |
| 7,281,694 B2 * | 10/2007 | Allen et al. | ............... 248/244 |
| 7,284,672 B2 * | 10/2007 | Tsai | ............... 211/208 |
| 2004/0108427 A1 * | 6/2004 | Chen et al. | ............... 248/244 |
| 2004/0217073 A1 * | 11/2004 | Dobler et al. | ............... 211/26 |
| 2004/0233643 A1 * | 11/2004 | Bolich et al. | ............... 361/727 |
| 2006/0152115 A1 * | 7/2006 | Dubon et al. | ............ 312/334.8 |
| 2008/0284300 A1 * | 11/2008 | Wu et al. | ............... 312/334.1 |
| 2009/0114785 A1 * | 5/2009 | Huang et al. | ........... 248/220.31 |
| 2009/0261699 A1 * | 10/2009 | Yu et al. | ............... 312/334.46 |

* cited by examiner

*Primary Examiner*—Janet M Wilkens
(74) *Attorney, Agent, or Firm*—Frank R. Niranjan (57) ABSTRACT

A server rack assembly for supporting a receiving bracket accommodating a plurality of electronic components, includes a base, a pair of rails mounted on the base, and at least one pair of securing brackets. The base spacedly protrudes two pairs of opposite stands. At lease one first positioning hole is defined in each stand. Each rail spans between the respective stands and is mounted thereon. One of the securing brackets is securely mounted on a rear end of one of the rails, and the other securing bracket is slidably attached to a front end of the rail. Each securing bracket protrudes at least one positioning member for inserting in the at least one first positioning hole. A sliding member attached to each securing bracket elastically abuts against one corresponding stand for preventing the positioning member being disengaged from the positioning hole of the stand.

12 Claims, 7 Drawing Sheets

FIG. 7

SERVER RACK ASSEMBLY

BACKGROUND

1. Field of the Invention

The present invention relates to a server rack assembly with a mounting assembly suitable for mounting a rail to different server rack bases.

2. Description of Related Art

Server system racks have been provided for housing electronic equipment, such as network server systems, data storage devices, power supplies, and the like. A server rack assembly generally includes a base and a pair of rail structures for attaching a receiving bracket to the base. Conventionally, a rail structure includes an internal rail mounted on the receiving bracket, and an external rail mounted on the base. The internal rail is slidably received in the external rail for mounting the receiving bracket on the base. The external rail is usually mounted on the base by screwing or bolting. However, this method is of a fixed structure where each external rail is only suitable for mounting on one particular kind of base. In actual use, base designs vary, and so costs are higher because a unique rail must be designed and manufactured for each kind of base.

What is needed, therefore, is a mounting assembly suitable for mounting the rail to different bases.

SUMMARY

A server rack assembly for supporting a receiving bracket accommodating a plurality of electronic components, includes a base, a pair of rails mounted on the base, and at least one pair of securing brackets. Two pairs of spaced stands extend from the base. At lease one first positioning hole is defined in each stand. Each rail spans between the respective stands and is mounted thereon. One of the securing brackets is securely mounted on a rear end of one of the rails, and the other securing bracket is slidably attached to a front end of the rail. At least one positioning member extends from each securing bracket for inserting in the at least one first positioning hole. A sliding member attached to each securing bracket elastically abuts against one corresponding stand for preventing the positioning member retracting from the positioning hole of the respective stand.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
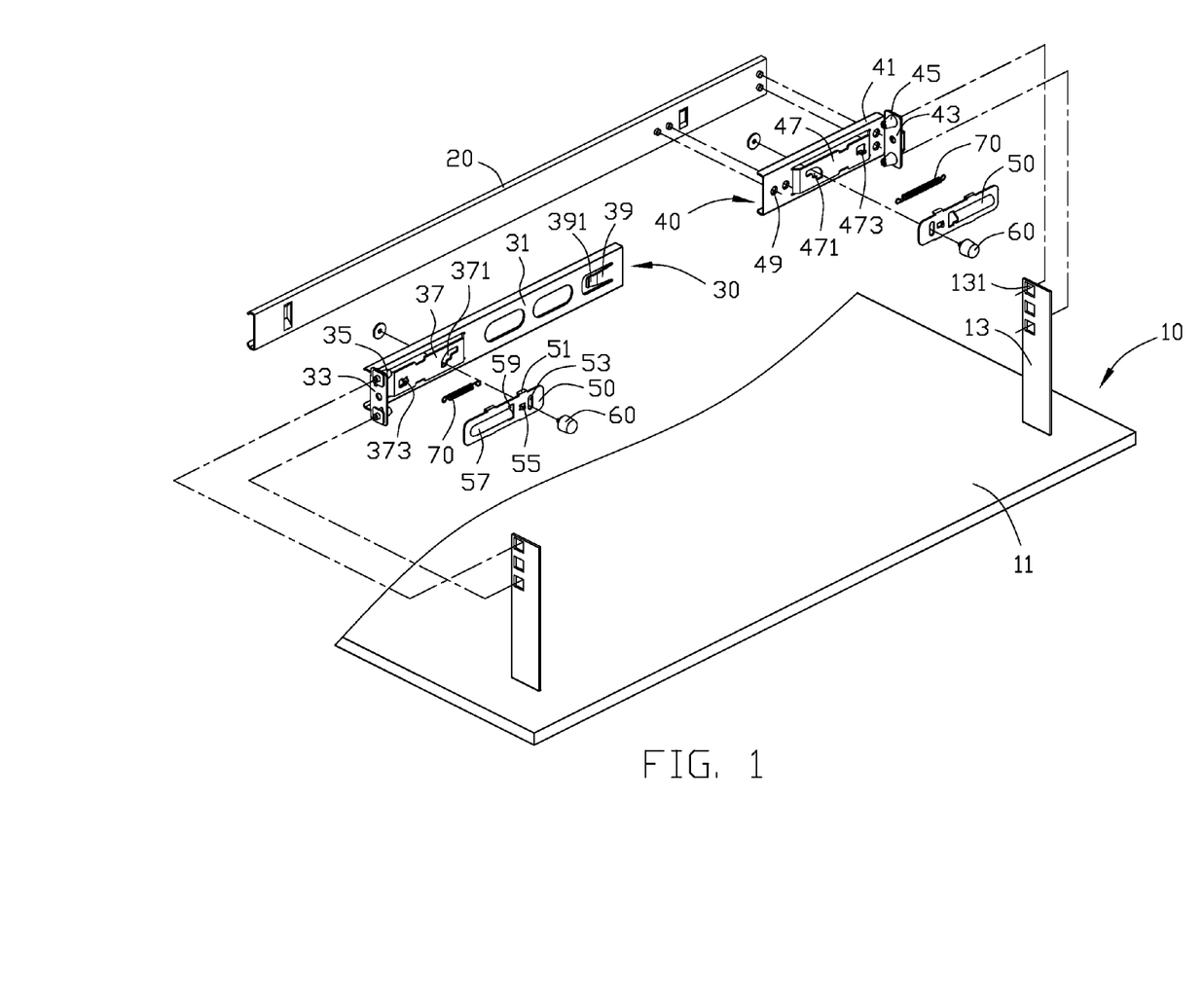
FIG. 1 is an exploded, isometric partial view of a server rack assembly in accordance with a preferred embodiment, including a base, a rail, and a pair of mounting assemblies.
Figure 4:
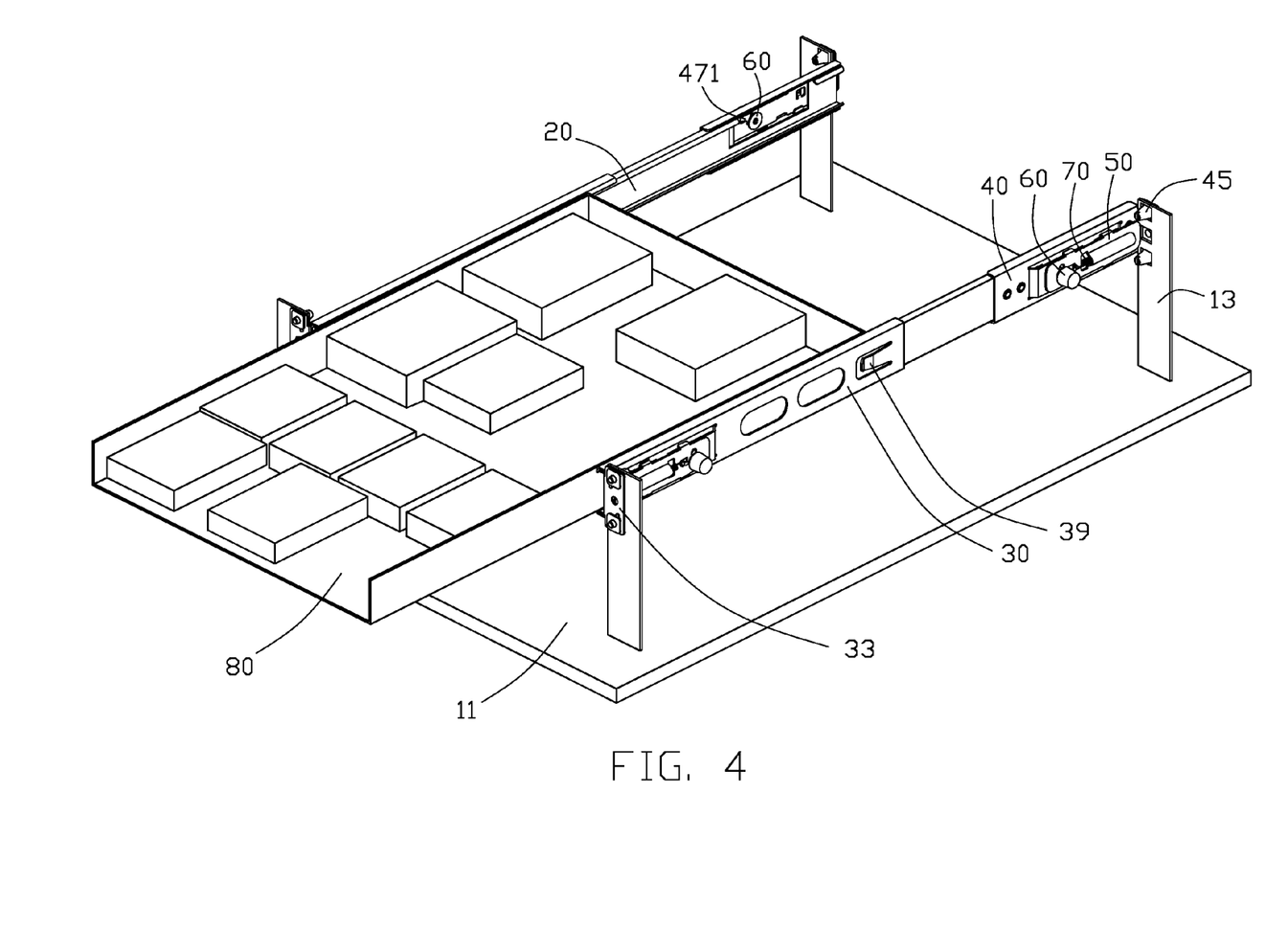
FIG. 4 is an assembled view of the server rack assembly in accordance with the preferred embodiment with a receiving bracket accommodating a plurality of electronic devices.

Referring to FIGS. 1 and 4, a server rack assembly includes a base 10, and a pair of rails 20 (only one rail shown in FIG. 1) mounted on the base 10 for supporting a receiving bracket 80. A plurality of electronic components is accommodated in the receiving bracket 40. Each rail 20 is mounted on the base 10 by a mounting assembly. Each mounting assembly includes a pair of securing brackets 30, 40 mounted on the rail 20, and a pair of sliding members 50 elastically mounted on the securing brackets 30, 40. The base 10 includes a rectangular plate 11 (partially shown in FIG. 1). A stand 13 perpendicularly extends up from near each of the four corners (just two corners shown in FIG. 1) of the plate 11, for supporting an end portion of the corresponding rail 20 thereon. Each stand 13 defines a pair of square positioning holes 131. The securing bracket 30 is slidably mounted on a front end of the rail 20, for adjustably mounting the rail 20 to different bases, and the other securing bracket 40 is fixed on a rear end of the rail 20.

The securing bracket 30 is substantially L-shaped, and includes a rectangular main body 31 embracing the rail 20 and a sidewall 33 parallel to the front stand 13 perpendicularly extending from an edge of the main body 31. A pair of first positioning members 35 protrudes from the sidewall 33 corresponding to the positioning holes 131 in the front stand 13. In the present embodiment, the first positioning members 35 are cone-shaped pins. One end of the main body 31 adjacent to the sidewall 33 is stamped to form a bridge 37. A stepped slot 371 is defined in a first end of the bridge 37. A hook 373 protrudes from an opposite end of the bridge 37. The stepped slot 371 forms three aligned receiving portions. An elastic tab 39 with a bent end 391 extending toward the rail 20 is formed at the other end of the main body 31 far from the sidewall 33. When the securing bracket 30 is slidably attached to the rail 20, the bent end 391 of the elastic tab 39 is forced to deform by a side face of the rail 20. Thus, the securing bracket 30 is forced to tightly abut against the rail 20 by a restoring force of the elastic tab 39.

The securing bracket 40 is similar to the securing bracket 30, and includes a rectangular main body 41 embracing the rail 20 and a sidewall 43 parallel to the rear stand 13 perpendicularly extending from an edge of the main body 41. A pair of first positioning members 45 protrudes from the sidewall 43 corresponding to the positioning holes 131 in the rear stand 13. A center of the main body 41 is stamped to form a bridge 47. A stepped slot 471 is defined in one end of the bridge 47. A hook 473 protrudes from the other end of the bridge 47. A plurality of securing holes 49 is defined in the bridge 47, for a plurality of securing members extending therethrough to secure the securing bracket 40 to the rail 20.

Each sliding member 50 includes a rectangular base. A plurality of bent tabs 51 is formed at two opposite edges of the base and together defines a pair of channels for two edges of the corresponding bridge 37 or 47 received therein, thereby the sliding member 50 is slidable along the bridge 37 or 47. A vertical guiding slot 53 is defined in a first end of the sliding member 50 corresponding to the stepped slot 371 or 471. A second positioning member 60 extends through the stepped slot 371 or 471 and the guiding slot 53, for positioning the sliding member 50 in one of the receiving portions of the securing bracket 30 or 40. A half cylinder-shaped recess 57 facing the securing bracket 30 or 40 is defined in an opposite second end of the sliding member 50. An opening 59 is defined at one end of the recess 57. A hook 55 protrudes from a face of the sliding member 50 opposite to the bridge 37 between the guiding slot 53 and the recess 57. A spring 70 is received in the recess 57, with one end of the spring 70 connected to the hook 373 of the securing bracket 30, and the other end of the spring 70 extending through the opening 59 of the sliding member 50 and connected to the hook 55.

Figure 2:
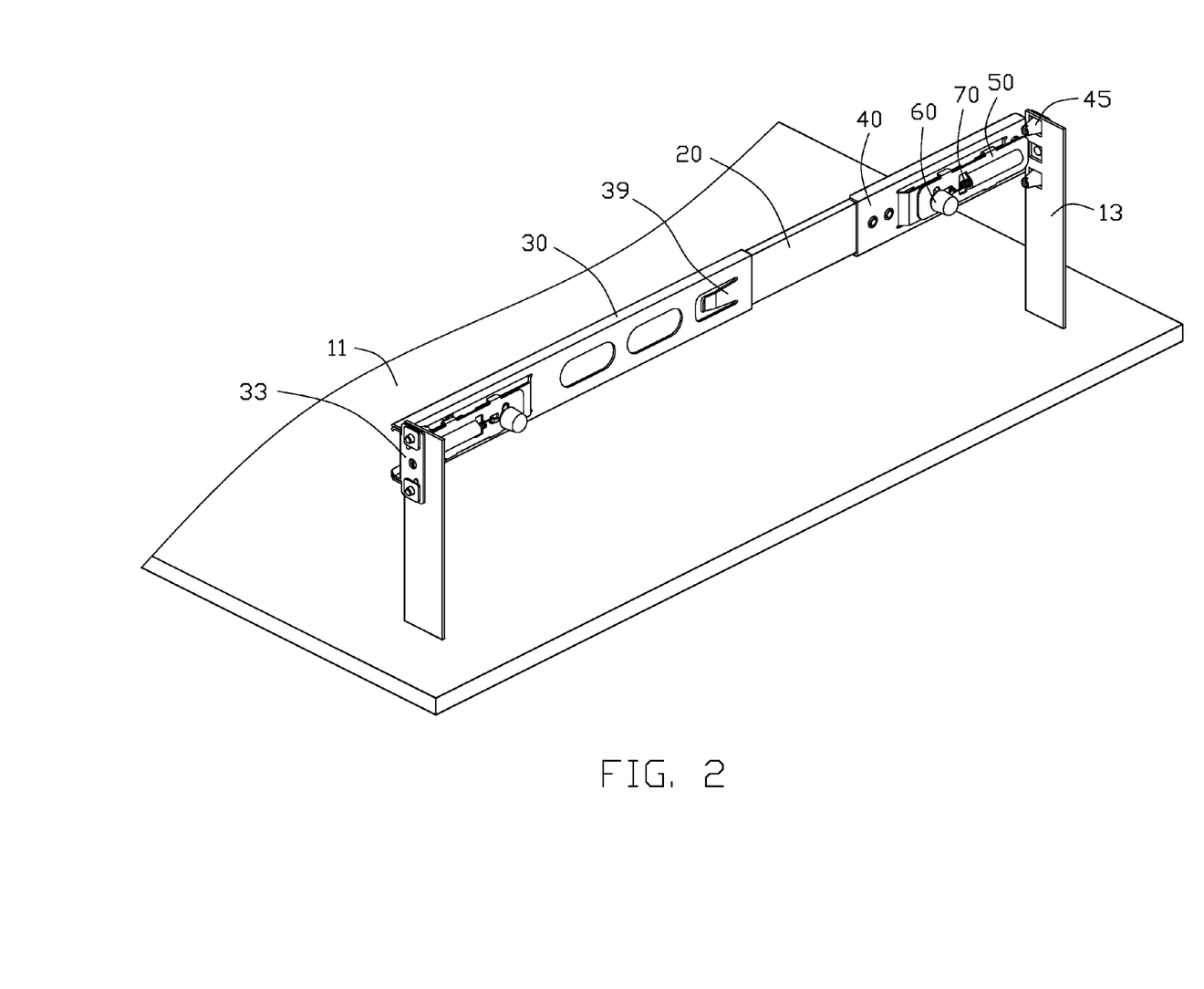
FIG. 2 is an assembled view of the server rack assembly of FIG. 1 when the mounting assemblies are fixed in a first position.
Figure 3:
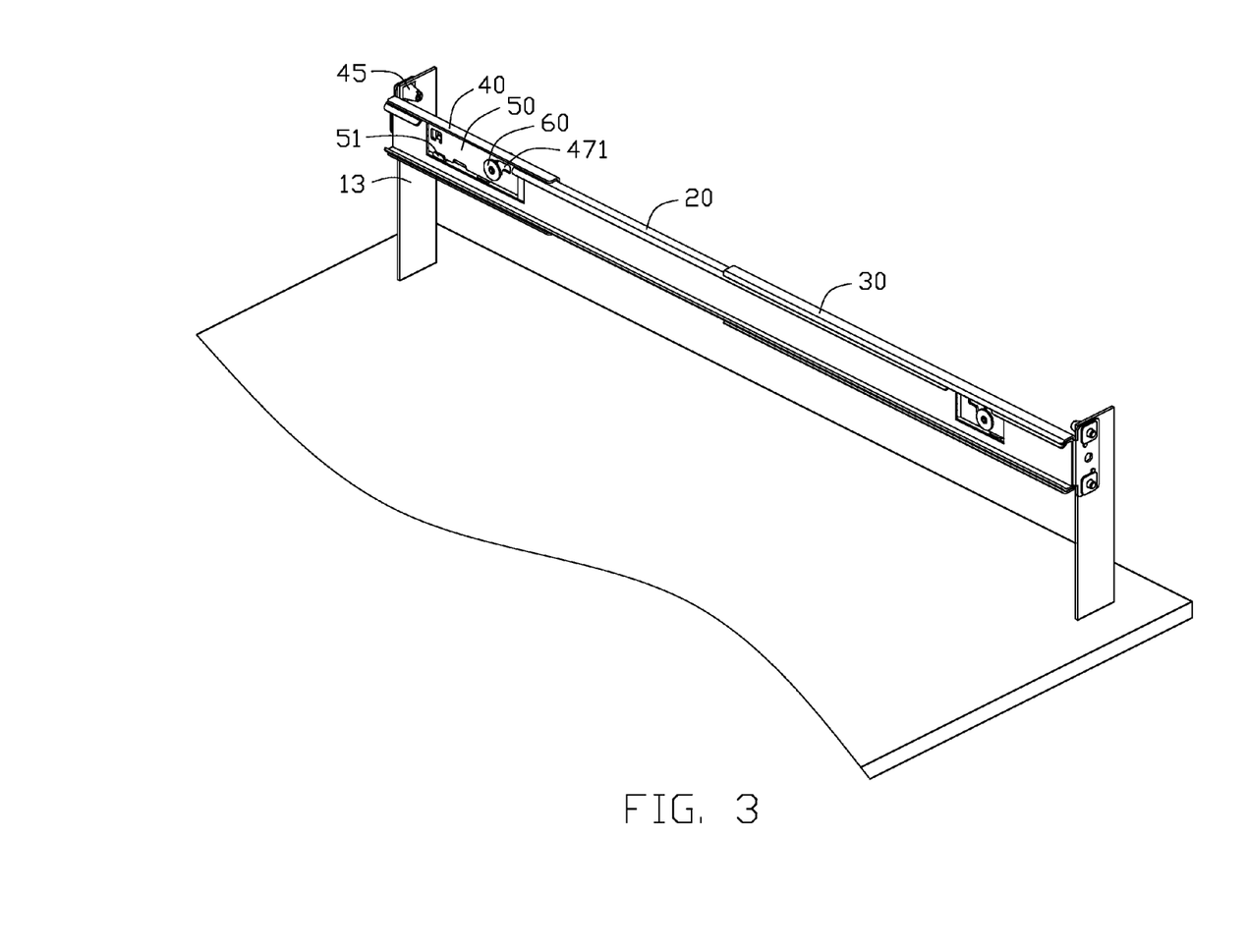
FIG. 3 is similar to FIG. 2 with part of the rail being removed, but viewed in another aspect.

Referring also to FIGS. 2 and 3, in an initial state, the springs 70 is stretched. The second positioning members 60 are positioned in one of the receiving portions of the stepped slots 371 and 471 that are most close to the sidewalls 33 and 43 of the securing brackets 50. Distal ends of the sliding members 50 abut against the sidewalls 33 and 43 of the securing brackets 30 and 40 due to restoring force of the springs 70. In assembly, the second positioning member 60 on the securing bracket 40 is pushed to move away from the sidewall 43 of the securing bracket 40 along the stepped slot 471 and slide up along the guiding slot 53, thereby pulling the sliding member 50 to move away from the sidewall 43 of the securing bracket 40. The spring 70 is stretched further. And a mounting room is defined between the distal end of the sliding member 50 and the sidewall 33 of the securing bracket 30. The rear stand 13 is inserted in the mounting room for allowing the first positioning members 45 to extend through the square hole 131 in the stand 13. The second positioning member 60 is released. The sliding member 50 moves toward the sidewall 43 of the securing bracket 40 and abuts against the stand 13. Thus, the stand 13 is sandwiched between the sliding member 50 and the sidewall 43 of the securing bracket 40. Meanwhile, the second positioning member 60 is pulled to move toward the sidewall 43 along the stepped slot 471 and the vertical guiding slot 53 by the restoring force of the spring 70. In this embodiment, the positioning holes 131 in the stand 13 are square and large than the biggest radius of the first positioning members 45. Therefore, the first positioning members 45 entirely extend through the positioning holes 131, and the stand 13 abuts the sidewall 43 of the securing bracket 40. The second positioning member 60 drops in the lowest receiving portion most close to the sidewall 33 to position the sliding member 50 in place (shown in FIG. 3). Thereby, the rear portion of the rail 20 is fastened on the base 10.

Then, the second positioning member 60 on the securing bracket 40 attached to the front portion of the rail 20 is pushed to move away from the sidewall 43 of the securing bracket 40 along the stepped slot 471 and slide up along the guiding slot 53, thereby pulling the sliding member 50 to move away from the sidewall 43 of the securing bracket 40. The spring 70 is further stretched. And a mounting room is defined between the distal end of the sliding member 50 and the sidewall 43 of the securing bracket 40. Then, the securing bracket 40 is slid along the rail 20 to adjust a position on the rail 20 for a side edge of the front stand 13 being inserted in the mounting room for allowing the first positioning members 45 to extend through the square hole 131 in the stand 13. The second positioning member 60 is released. The sliding member 50 moves toward the sidewall 43 of the securing bracket 40 and abuts against the stand 13. Thus, the stand 13 is sandwiched between the sliding member 50 and the sidewall 43 of the securing bracket 40. Meanwhile, the second positioning member 60 is pulled to move toward the sidewall 43 along the stepped slot 471 and the vertical guiding slot 53 by the restoring force of the spring 70, and then drops in the lowest receiving portion most close to the sidewall 43 to position the sliding member 50 in place. Thereby, the front portion of the rail 20 is fastened on the base 10.

Figure 5:
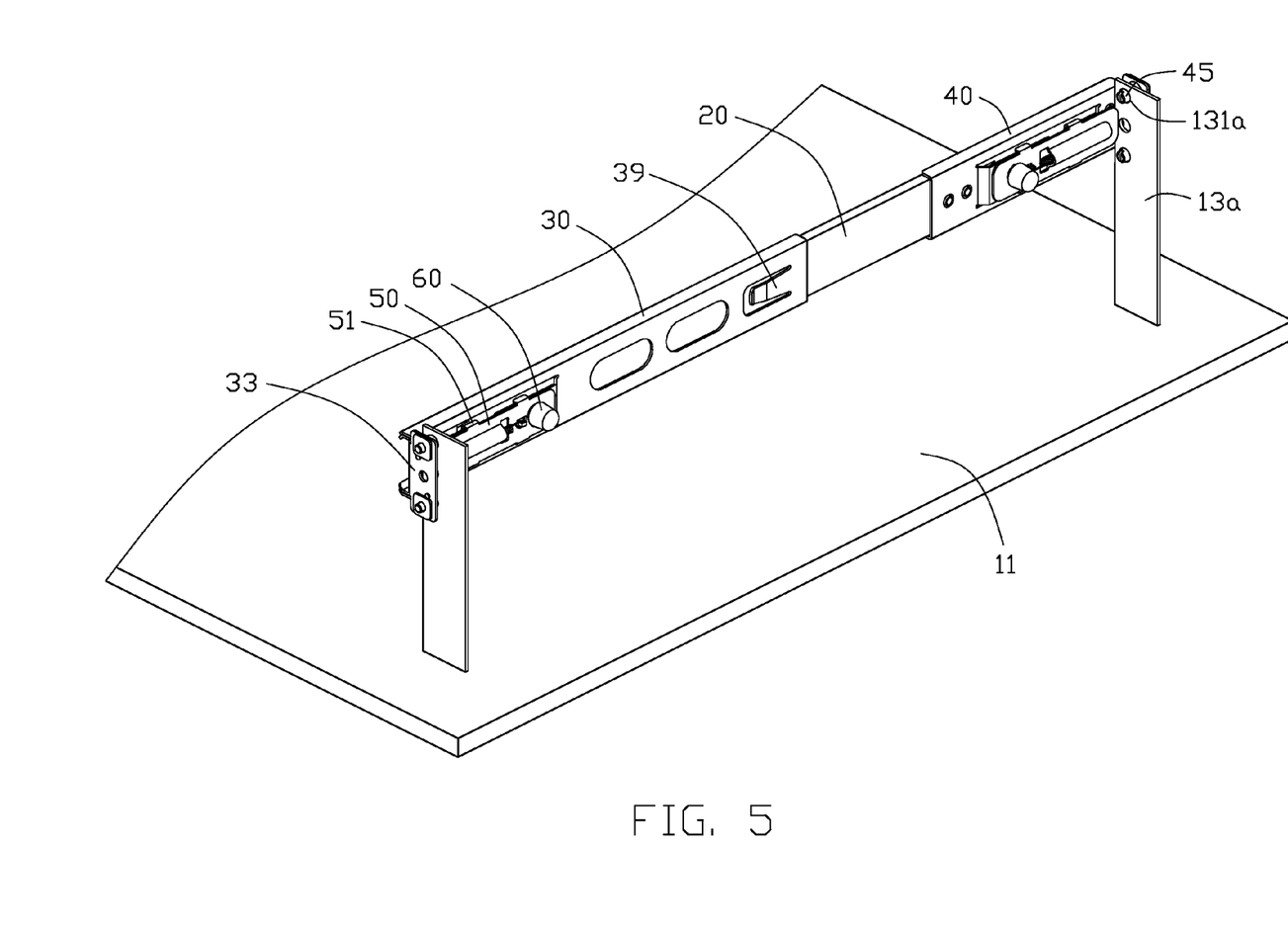
FIG. 5 is an assembled partial view of the server rack assembly in accordance with an alternative embodiment, with the mounting assemblies being fixed in a second position.
Figure 6:
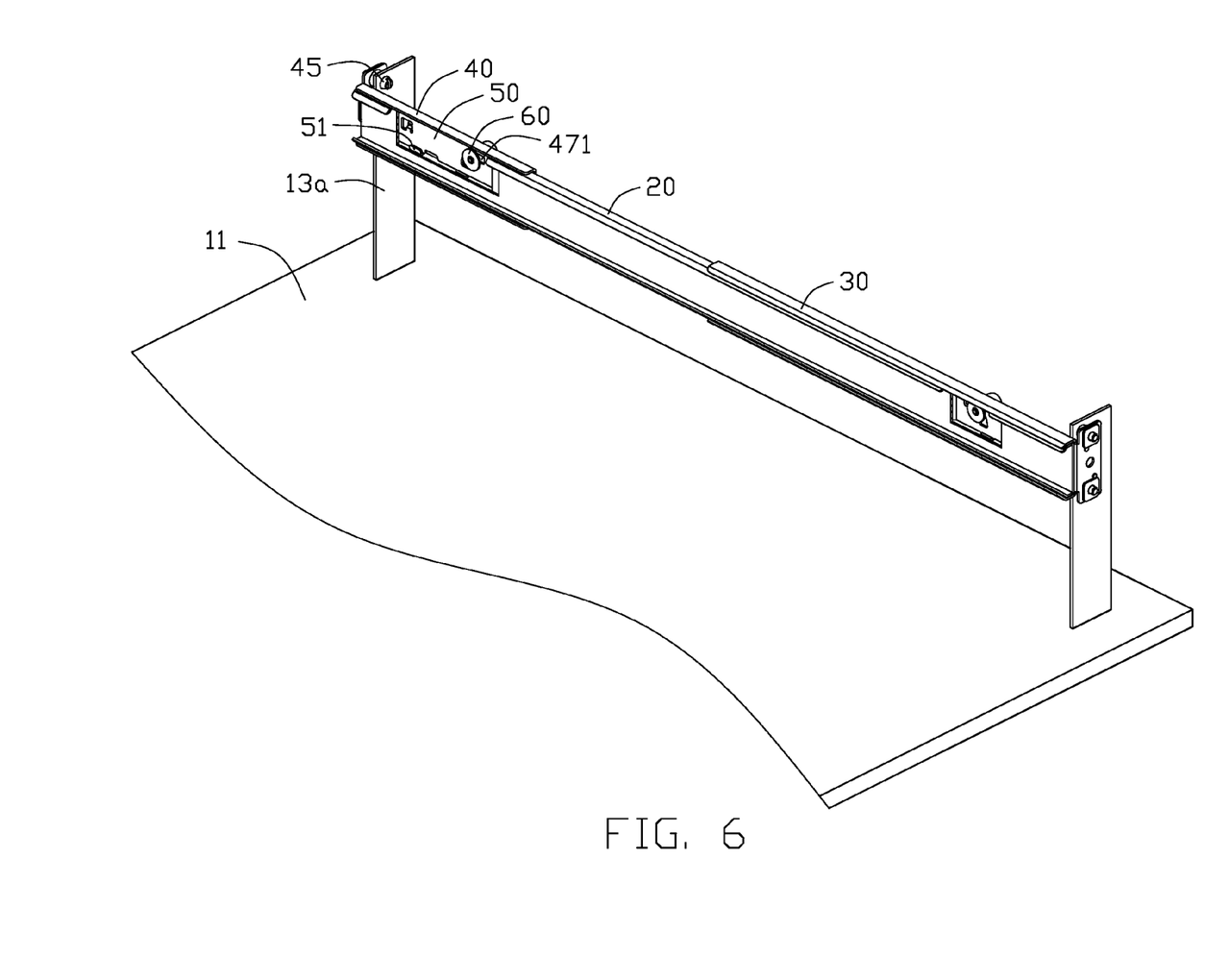
FIG. 6 is similar to FIG. 5 with part of the rail being removed, but viewed in another aspect.

Referring also to FIGS. 5 and 6, an alternative embodiment of the present invention is shown. Each stand 13 of the base 10 defines a round positioning hole 131a. In assembly, the first positioning members (cone-shaped pin) 35 and 45 are partially inserted in the corresponding positioning holes 131a and blocked thereby. When the sliding members 50 are released, the second positioning members 60 drop in the middle receiving portions of the stepped slots 371 and 471 of the securing bracket 30 and 40 to position the sliding member 50 in place.

Figure 7:
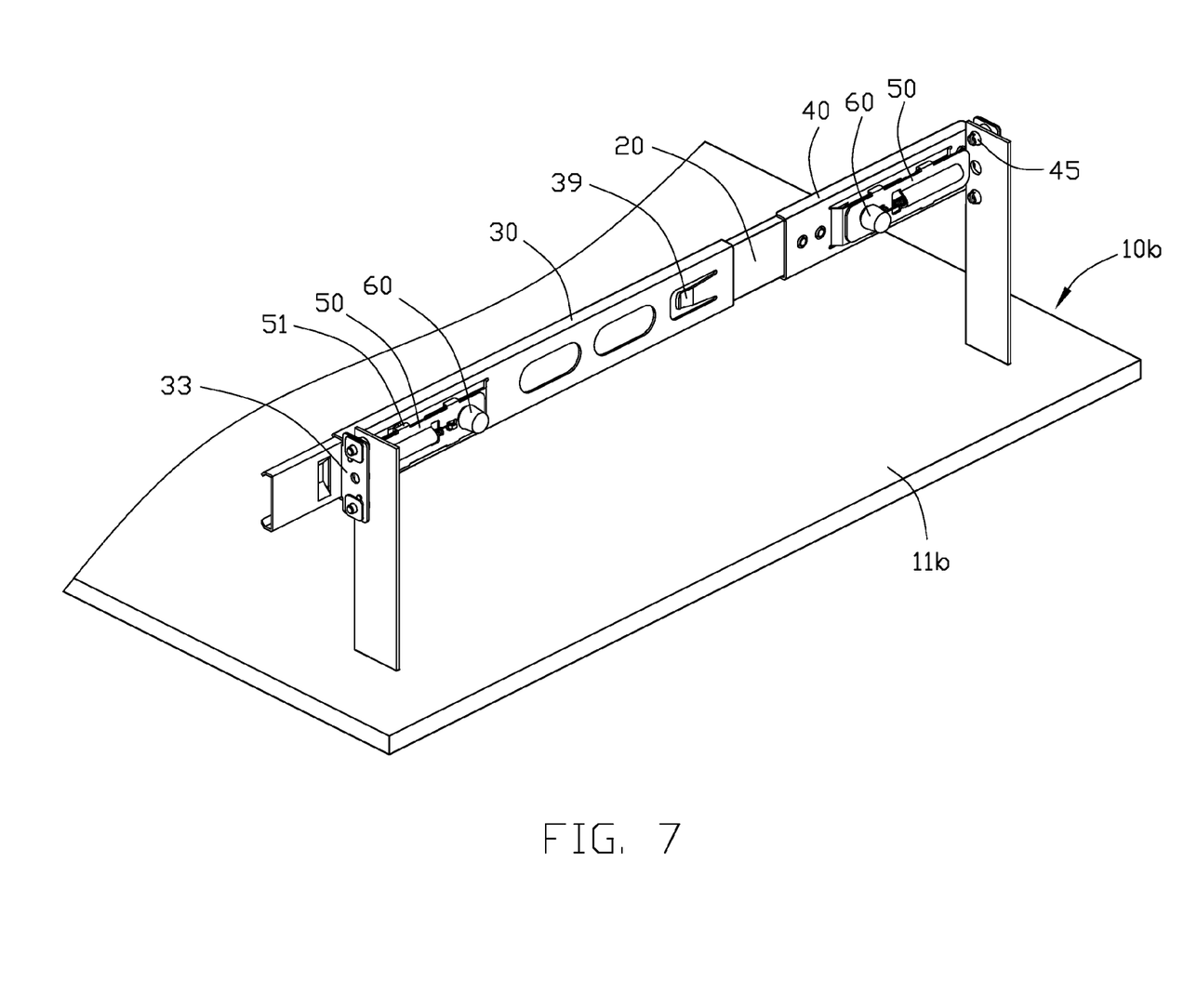
FIG. 7 is an assembled partial view of the server rack assembly in accordance with a third embodiment, wherein the rail is mounted on a small base.

Referring to FIG. 7, a third embodiment of the present invention is shown. The base 10b is smaller than that of the first and second embodiments. Distance between the stands 13b is smaller than the length of the rail 20. The securing bracket 40 slides along the rail 20 and is mounted on a proper portion of the rail 20 for matching with the small base 10b.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server rack assembly for supporting a receiving bracket accommodating a plurality of electronic components, comprising:

a base spacedly protruding two pairs of opposite stands, at least one first positioning hole being defined in each of the stands;

a pair of rails configured for supporting the receiving bracket, each of the rails spanning between the respective stands and mounted thereon; and at least one pair of securing brackets for mounting the rails to the base, one of the securing brackets securely mounted to a rear end of the rail, the other securing bracket slidably attached to a front end of the rail, each securing bracket protruding at least one positioning member to engage the at least one first positioning hole, a sliding member attached to each of the securing brackets and elastically abutting against the corresponding stand to prevent the positioning member being disengaged from the first positioning hole of the respective stand;

wherein each securing bracket comprises a main body embracing the rail and a sidewall perpendicularly protruding an edge of the main body, and the at least one first positioning member protrudes from the sidewall; and a bridge is stamped in the main body of each of the securing brackets adjacent to the respective sidewall, and a plurality of bent tabs is formed on each of the sliding members for slidably engaging with the bridge.

2. The server rack assembly as described in claim 1, wherein a stepped slot is defined at one side of the bridge, the stepped slot having three receiving portions, a vertical guiding slot is defined in the sliding member corresponding to the stepped slot, and a second positioning member extends through the guiding slot and the stepped slot and engages in one of the receiving portions of the stepped slot for positioning the sliding member in place.

3. The server rack assembly as described in claim 2, wherein a pair of hooks respectively protrudes from the other side of the bridge and the sliding member adjacent to the guiding slot, a spring connected between the hooks for providing an elastic force to drive the sliding member to abut against the stand.

4. The server rack assembly as described in claim 3, wherein the hook on the sliding member is formed from a face of the sliding member opposite to the main body of the securing bracket, a half cylinder-shaped recess is defined in the other side of the sliding member, and an opening defined at one end of the recess, the spring is received in the recess with one end extending through the opening and engaged with the hook on the sliding member.

5. The server rack assembly as described in claim 1, wherein an elastic member is formed on the main body far from the sidewall of the receiving bracket, for forcing the receiving bracket to abut the rail.

6. The server rack assembly as described in claim 1, wherein the first positioning member is a cone-shaped pin.

7. A server rack assembly, comprising:
- a receiving bracket configured for accommodating a plurality of electronic devices;
- a base spacedly protruding two pairs of opposite stands, at lease one first positioning hole is defined in each stand;
- a pair of rails supporting the receiving bracket, each of the rails spanning between the respective stand and mounted thereon; and
- at least one pair of securing brackets for mounting one of the rails to the base, one of the securing bracket securely mounted to a rear end of the rail, the other securing bracket slidably attached to a front end of the rail, each securing bracket comprising a main body embracing the rail and a sidewall perpendicular to the main body, at least one positioning member protruding from the sidewall and engaged with the at least one first position hole, a sliding member slidably attached to the main body of each securing bracket in parallel, a spring with one end connected to the main body of the securing bracket and the other end movable with the sliding member, the spring driving the sliding member to slide along the main body of the securing bracket and abut against the stand, thereby sandwiching the stand between the sidewall of the securing bracket and an end of the sliding member;
- wherein a bridge is stamped in the main body of each of the securing brackets adjacent to the respective sidewall, and a plurality of bent tabs is formed on each of the sliding members for slidably engaging with the bridge.

8. The server rack assembly as described in claim 7, wherein a stepped slot is defined at one side of the bridge, the stepped slot having three receiving portions, a vertical guiding slot is defined in the sliding member corresponding to the stepped slot, and a second positioning member extends through the guiding slot and the stepped slot and engages in one of the receiving portions of the stepped slot for positioning the sliding member in place.

9. The server rack assembly as described in claim 8, wherein a pair of hooks respectively protrudes from the other side of the bridge and the sliding member adjacent to the guiding slot, and a spring connected between the hooks.

10. The server rack assembly as described in claim 9, wherein the hook on the sliding member is formed from a face of the sliding member opposite to the main body of the securing bracket, a half cylinder-shaped recess is defined in the other side of the sliding member, and an opening defined at one end of the recess, the spring is received in the recess with one end extending through the opening and engaged with the hook on the sliding member.

11. The server rack assembly as described in claim 7, wherein an elastic member is formed on the main body far from the sidewall of the receiving bracket, for forcing the receiving bracket to abut against the rail.

12. The server rack assembly as described in claim 7, wherein the first positioning member is a cone-shaped pin.

* * * * *